US012219700B2

United States Patent
Kim et al.

(10) Patent No.: US 12,219,700 B2
(45) Date of Patent: Feb. 4, 2025

(54) CIRCUIT BOARD

(71) Applicant: LG INNOTEK CO., LTD., Seoul (KR)

(72) Inventors: Yong Suk Kim, Seoul (KR); Dong Hwa Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 289 days.

(21) Appl. No.: 17/636,063

(22) PCT Filed: Aug. 25, 2020

(86) PCT No.: PCT/KR2020/011288
§ 371 (c)(1),
(2) Date: Feb. 17, 2022

(87) PCT Pub. No.: WO2021/040364
PCT Pub. Date: Mar. 4, 2021

(65) Prior Publication Data
US 2022/0287174 A1 Sep. 8, 2022

(30) Foreign Application Priority Data

Aug. 26, 2019 (KR) .................. 10-2019-0104273

(51) Int. Cl.
*H05K 1/02* (2006.01)
*H05K 1/05* (2006.01)
(Continued)

(52) U.S. Cl.
CPC ........... *H05K 1/0298* (2013.01); *H05K 1/056* (2013.01); *H05K 1/115* (2013.01); *H05K 1/0366* (2013.01);
(Continued)

(58) Field of Classification Search
CPC ...... H05K 1/0298; H05K 1/056; H05K 1/115; H05K 2201/0137; H05K 2201/068;
(Continued)

(56) References Cited

U.S. PATENT DOCUMENTS 9,642,246 B2    5/2017  Nam et al.
2005/0218503 A1* 10/2005  Abe .................. H01L 23/49822
                                                     257/700
(Continued)

FOREIGN PATENT DOCUMENTS

CN          1968577      5/2007
CN         102548184     7/2012
(Continued)

OTHER PUBLICATIONS

Chinese Office Action dated Aug. 27, 2023 issued in Application No. 202080060580.7.
(Continued)

*Primary Examiner* — Steven T Sawyer
(74) *Attorney, Agent, or Firm* — KED & ASSOCIATES, LLP

(57) ABSTRACT

A circuit board according to an embodiment includes a first insulating portion including at least one insulating layer; a second insulating portion disposed on the first insulating portion and including at least one insulating layer; and a third insulating portion disposed under the first insulating portion and including at least one insulating layer; wherein the insulating layer constituting the first insulating portion includes a prepreg containing glass fibers, and wherein each of the insulating layers constituting the second and third insulating portions is made of resin coated copper (RCC).

14 Claims, 7 Drawing Sheets

(51) Int. Cl.
  *H05K 1/11* (2006.01)
  *H05K 1/03* (2006.01)
(52) U.S. Cl.
  CPC ............... *H05K 2201/0137* (2013.01); *H05K 2201/068* (2013.01); *H05K 2201/096* (2013.01); *H05K 2201/09827* (2013.01)
(58) Field of Classification Search
  CPC ... H05K 2201/096; H05K 2201/09827; H05K 1/024; H05K 3/386; H05K 3/388; H05K 3/4688; H05K 1/0366; H05K 2201/029; H05K 2201/0296; H01L 23/49822; H01L 23/5385; H01L 23/15
  See application file for complete search history.

(56) References Cited

U.S. PATENT DOCUMENTS

| | | | | |
|---|---|---|---|---|
| 2009/0214881 | A1* | 8/2009 | Chang | H05K 1/162 |
| | | | | 156/89.16 |
| 2011/0247208 | A1* | 10/2011 | Ikeda | H01L 21/4857 |
| | | | | 29/830 |
| 2014/0127483 | A1 | 5/2014 | Moon et al. | |
| 2015/0030824 | A1* | 1/2015 | Crosley | H05K 1/0373 |
| | | | | 428/206 |
| 2015/0041184 | A1 | 2/2015 | Nam et al. | |
| 2015/0060115 | A1 | 3/2015 | Lee et al. | |
| 2015/0179560 | A1* | 6/2015 | Arisaka | H01L 23/49827 |
| | | | | 257/777 |
| 2020/0168536 | A1* | 5/2020 | Link | H01L 23/49827 |
| 2020/0312759 | A1* | 10/2020 | Collins | H01L 23/66 |
| 2021/0153346 | A1* | 5/2021 | Yoshihara | C08L 63/00 |

FOREIGN PATENT DOCUMENTS

| | | |
|---|---|---|
| CN | 104247584 | 12/2014 |
| CN | 107108782 | 8/2017 |
| JP | 2007-245674 | 9/2007 |
| JP | 2015-38909 | 2/2015 |
| JP | 2015-044397 | 3/2015 |
| KR | 10-2006-0003847 | 1/2006 |
| KR | 10-2007-0021631 | 2/2007 |
| KR | 10-2014-0059542 | 5/2014 |
| KR | 10-2018-0036871 | 4/2018 |
| WO | WO 2016/104748 | 6/2016 |

OTHER PUBLICATIONS

International Search Report dated Dec. 4, 2020 issued in Application No. PCT/KR2020/011288.
Chinese Office Action dated Apr. 27, 2024 issued in Application No. 202080060580.7.
Japanese Office Action dated Aug. 27, 2024 issued in Application No. 2022-513367.

* cited by examiner

CIRCUIT BOARD

CROSS-REFERENCE TO RELATED PATENT APPLICATIONS

This application is a U.S. National Stage Application under 35 U.S.C. § 371 of PCT Application No. PCT/KR2020/011288, filed Aug. 25, 2020, which claims priority to Korean Patent Application No. 10-2019-0104273, filed Aug. 26, 2019, whose entire disclosures are hereby incorporated by reference.

TECHNICAL FIELD

The embodiment relates to a circuit board, and more particularly, to a circuit board including an insulating layer having a low dielectric constant and a low coefficient of thermal expansion.

BACKGROUND ART

A printed circuit board (PCB) is formed by printing a circuit line pattern on an electrically insulating substrate with a conductive material such as copper, and refers to a board immediately before mounting electronic components. That is, in order to densely mount many types of electronic devices on a flat plate, it means a circuit board on which a mounting position of each part is determined and a circuit pattern connecting the parts is printed on the flat plate surface and fixed.

In general, as a surface treatment method of a circuit pattern included in the printed circuit board as described above, OSP (Organic Solderability Preservative), electrolytic nickel/gold, electrolytic nickel/gold-cobalt alloy, electroless nickel/palladium/gold, etc. are used.

In this case, the surface treatment methods used vary depending on their use, for example, the use includes a soldering use, a wire bonding use, a connector use, and the like.

Components mounted on the printed circuit board may transmit a signal generated from the component by a circuit pattern connected to each component.

On the other hand, recent portable electronic devices and the like are becoming highly functional, in order to perform high-speed processing of large amounts of information, high-frequency signals are being developed, and accordingly, there is a demand for a circuit pattern of a printed circuit board suitable for high-frequency applications.

In order to enable transmission of such a circuit pattern of a printed circuit board without degrading the quality of a high-frequency signal, a reduction in transmission loss is desired.

Transmission loss of a circuit pattern of a printed circuit board mainly consists of a conductor loss resulting from copper foil and dielectric loss resulting from an insulator.

The conductor loss due to the copper foil is related to a surface roughness of the circuit pattern. That is, as the surface roughness of the circuit pattern increases, transmission loss may increase due to a skin effect.

Accordingly, when the surface roughness of the circuit pattern is reduced, there is an effect of preventing a reduction in transmission loss, but there is a problem in that the adhesion between the circuit pattern and the insulating layer is reduced.

In addition, in order to reduce a dielectric constant, a material having a small dielectric constant may be used as an insulating layer of the circuit board.

However, in the circuit board for high frequency applications, the insulating layer requires chemical and mechanical properties for use in the circuit board in addition to the low dielectric constant.

In details, it should have isotropy of electrical properties for ease of circuit pattern design and process, low reactivity with metal wiring materials, low ionic conductivity, sufficient mechanical strength to withstand processes such as chemical mechanical polishing (CMP), low moisture absorption, which can prevent delamination or increase in dielectric constant, heat resistance that can overcome the processing temperature, a low coefficient of thermal expansion to eliminate cracking due to temperature change, and furthermore, various conditions such as adhesion, crack resistance, low stress, and low high-temperature gas generation to minimize various stresses and peeling that may be generated at the interface with other materials must be satisfied.

Accordingly, there is a demand for an insulating layer for high-frequency applications with low dielectric constant and a circuit pattern having a small surface roughness while improving the adhesion between the insulating layer and the circuit pattern as well as the above chemical and mechanical properties.

DISCLOSURE

Technical Problem

In the embodiment, it is possible to achieve slimming of the circuit board.

In addition, in the embodiment, it is possible to provide a circuit board including an insulating layer having a low dielectric constant and a circuit pattern having a low signal loss.

In addition, in the embodiment, it is possible to provide a circuit board having an insulating layer formed of only resin coated copper (RCC) having a low coefficient of thermal expansion.

In addition, in the embodiment, the thickness of the circuit board can be reduced by a thickness corresponding to the glass fiber by removing the glass fiber included in the insulating layer.

In addition, in the embodiment, it is possible to provide a circuit board in which the thickness of the circuit pattern is greater than the thickness of the insulating layer.

The technical problems to be achieved in the proposed embodiment are not limited to the technical problems mentioned above, and other technical problems not mentioned in the embodiments will be clearly understood by those of ordinary skill in the art to which the embodiments proposed from the description below.

Technical Solution

A circuit board according to the embodiment comprises a first insulating portion including at least one insulating layer; a second insulating portion disposed on the first insulating portion and including at least one insulating layer; and a third insulating portion disposed under the first insulating portion and including at least one insulating layer; wherein the insulating layer constituting the first insulating portion includes a prepreg containing glass fibers, and wherein each of the insulating layers constituting the second and third insulating portions is made of resin coated copper (RCC).

In addition, a thickness of the insulating layer constituting the first insulating portion is greater than a thickness of each insulating layer constituting the second and third insulating portions.

In addition, the circuit board further comprises a circuit pattern disposed on a surface of each insulating layer of the first to third insulating portions, wherein the thickness of the insulating layer constituting the first insulating portion is greater than a thickness of the circuit pattern, and wherein the thickness of the insulating layer constituting the second and third insulating portions is smaller than the thickness of the circuit pattern.

In addition, the circuit board further comprises a via disposed in at least one insulating layer among the insulating layers constituting the first to third insulating portions; wherein a thickness of a via disposed in the insulating layer constituting the first insulating portion is greater than the thickness of the circuit pattern; and wherein a thickness of a via disposed in the insulating layer constituting the second and third insulating portions is smaller than the thickness of the circuit pattern.

In addition, each of the insulating layers constituting the second and third insulating portions includes a first compound including polyphenyl ether (PPE); and a second compound including tricyclodecane and a terminal group connected to the tricyclodecane, and wherein a weight ratio of the first compound to the second compound is 4:6 to 6:4.

In addition, the terminal group includes at least one of an acrylate group, an epoxide group, a carboxyl group, a hydroxyl group, and an isocyanate group.

In addition, the first compound and the second compound are not chemically bound.

In addition, a coefficient of thermal expansion and a dielectric constant of each of the insulating layers constituting the second and third insulating portions are smaller than a coefficient of thermal expansion and a dielectric constant of the insulating layer constituting the first insulating portion.

In addition, the dielectric constant of each of the insulating layers constituting the second and third insulating portions is 2.03 to 2.7.

On the other hand, the circuit board according to the embodiment includes an insulating portion including a plurality of insulating layers; a circuit pattern disposed on the surfaces of the plurality of insulating layers; and a via disposed in the plurality of insulating layers and connecting circuit patterns disposed on different layers, wherein each of the plurality of insulating layers is made of resin coated copper (RCC), and wherein dielectric constant of each of the plurality of insulating layers is 2.03 to 2.7.

In addition, a thickness of each of the plurality of insulating layers is smaller than a thickness of the circuit pattern.

In addition, a thickness of the via is smaller than the thickness of the circuit pattern.

In addition, each of the plurality of insulating layers includes a first material and a second material, wherein the first material includes first compounds that chemically bond to each other, wherein the second material includes second compounds that are chemically bound to each other, wherein each of the first compounds includes a polyphenyl ether (PPE), wherein each of the second compounds includes tricyclodecane and a terminal group connected to the tricyclodecane; wherein the second compounds bind to each other through the terminal group, wherein terminal group includes at least one of an acrylate group, an epoxide group, a carboxyl group, a hydroxyl group, and an isocyanate group.

Advantageous Effects

The circuit board according to the embodiment may include a buffer layer disposed between the insulating layer and the circuit pattern.

That is, in the circuit board according to the embodiment, the buffer layer may be formed on a surface of the circuit pattern or the buffer layer may be formed on the insulating layer.

The buffer layer may be disposed between the insulating layer and the circuit pattern to improve adhesion between the insulating layer and the circuit pattern.

That is, the insulating layer and the circuit pattern are heterogeneous materials including a resin material and a metal, respectively, and when the circuit pattern is formed on the insulating layer, there is a problem in that adhesion is reduced.

Accordingly, by disposing a buffer layer chemically bonded to the insulating layer and the circuit pattern between the insulating layer and the circuit pattern, adhesion between the insulating layer and the circuit pattern may be improved.

That is, the buffer layer includes a plurality of functional groups coupled to the insulating layer and the circuit pattern, the functional groups are chemically bonded to the insulating layer and the circuit pattern by a covalent bond or a coordination bond, and thereby adhesion between the insulating layer and the circuit pattern may be improved.

Accordingly, even when the surface roughness of the insulating layer is reduced, it is possible to secure adhesion reliability between the insulating layer and the circuit pattern.

Therefore, even when the circuit board according to the embodiment is used for a high frequency purpose, it is possible to reduce the transmission loss of the high frequency signal by maintaining the surface roughness of the circuit pattern low, even if the surface roughness of the circuit pattern is kept low, it is possible to secure the adhesion between the insulating layer and the circuit pattern by the buffer layer, and thereby, the overall reliability of the circuit pattern can be ensured.

In addition, the circuit board according to the embodiment may include an insulating layer having improved strength with a low dielectric constant and a low coefficient of thermal expansion.

In detail, the insulating layer includes a first material and a second material having a low dielectric constant and improved strength, and as the first material is formed in the insulating layer to be disposed inside the network structure of the second material, and thereby phase separation of the first material and the second material may be prevented. Accordingly, the insulating layer may form the first material and the second material as a single phase, thereby improving the strength of the insulating layer.

That is, by increasing the free volume, that is, molecular motion, of the second material having a network structure by cross-linking, polymer chains having a network structure can be structured so that they are not closely arranged, and as the first material is partially disposed inside the network structure, the first material and the second material may be formed as a single phase inside the insulating layer.

Therefore, when the circuit board according to the embodiment is used for high-frequency applications, it is possible to reduce the transmission loss of the high-frequency signal by reducing the dielectric constant of the insulating layer, and the overall reliability of the circuit board can be secured by improving the thermal expansion coefficient and mechanical strength of the insulating layer.

In addition, since the circuit board according to the embodiment includes an insulating layer having a low dielectric constant and a low thermal window coefficient, it can replace the existing insulating layer including glass fibers. Specifically, the circuit board according to the embodiment may remove the glass fiber included in the insulating layer. Specifically, in the circuit board according to the embodiment, the dielectric constant and the coefficient of thermal expansion of the insulating layer can be easily adjusted by using the resin and the filler constituting the RCC (Resin coated copper), and accordingly, the overall thickness of the printed circuit board can be reduced by configuring the insulating layer with the conventional RCC that does not include glass fibers. Furthermore, since the circuit board according to the embodiment is composed of an insulating layer having a low coefficient of thermal expansion, it is possible not only to remove the core layer for securing strength, but also to reduce the thickness of the insulating layer, and accordingly, it is possible to provide an insulating layer having a thickness smaller than that of the circuit pattern.

DETAILED DESCRIPTION OF THE EMBODIMENTS

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and substituted for use.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art.

Further, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (a), and (b) may be used. These terms are only used to distinguish the elements from other elements, and the terms are not limited to the essence, order, or order of the elements.

In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements.

Further, when expressed as "on (over)" or "under (below)", it may include not only the upper direction but also the lower direction based on one element.

Hereinafter, circuit boards according to embodiments will be described with reference to drawings.

Figure 1:
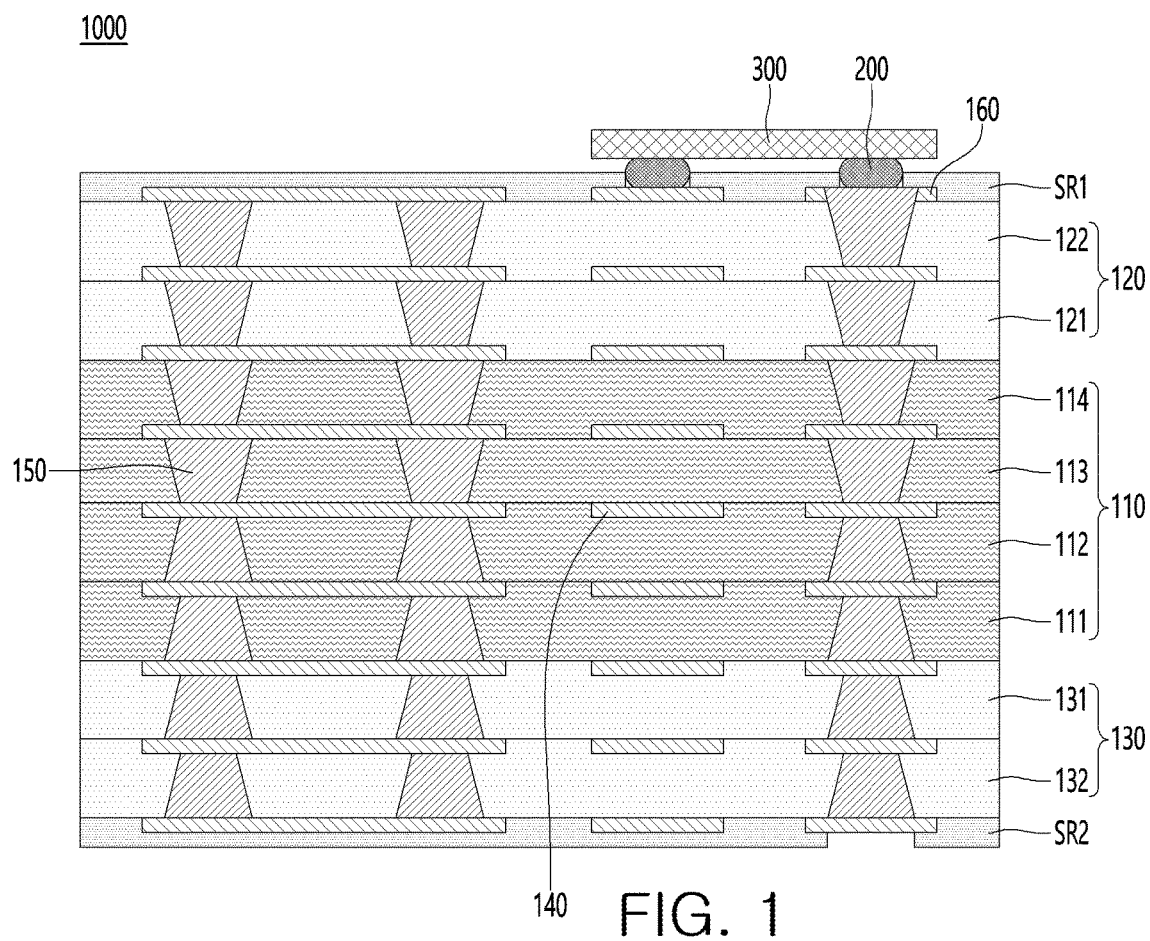
FIGS. 1 and 11 show a cross-sectional view of a circuit board according to a first embodiment.

FIG. 1 is a view showing a cross-sectional view of a circuit board according to a first embodiment.

Figure 9:
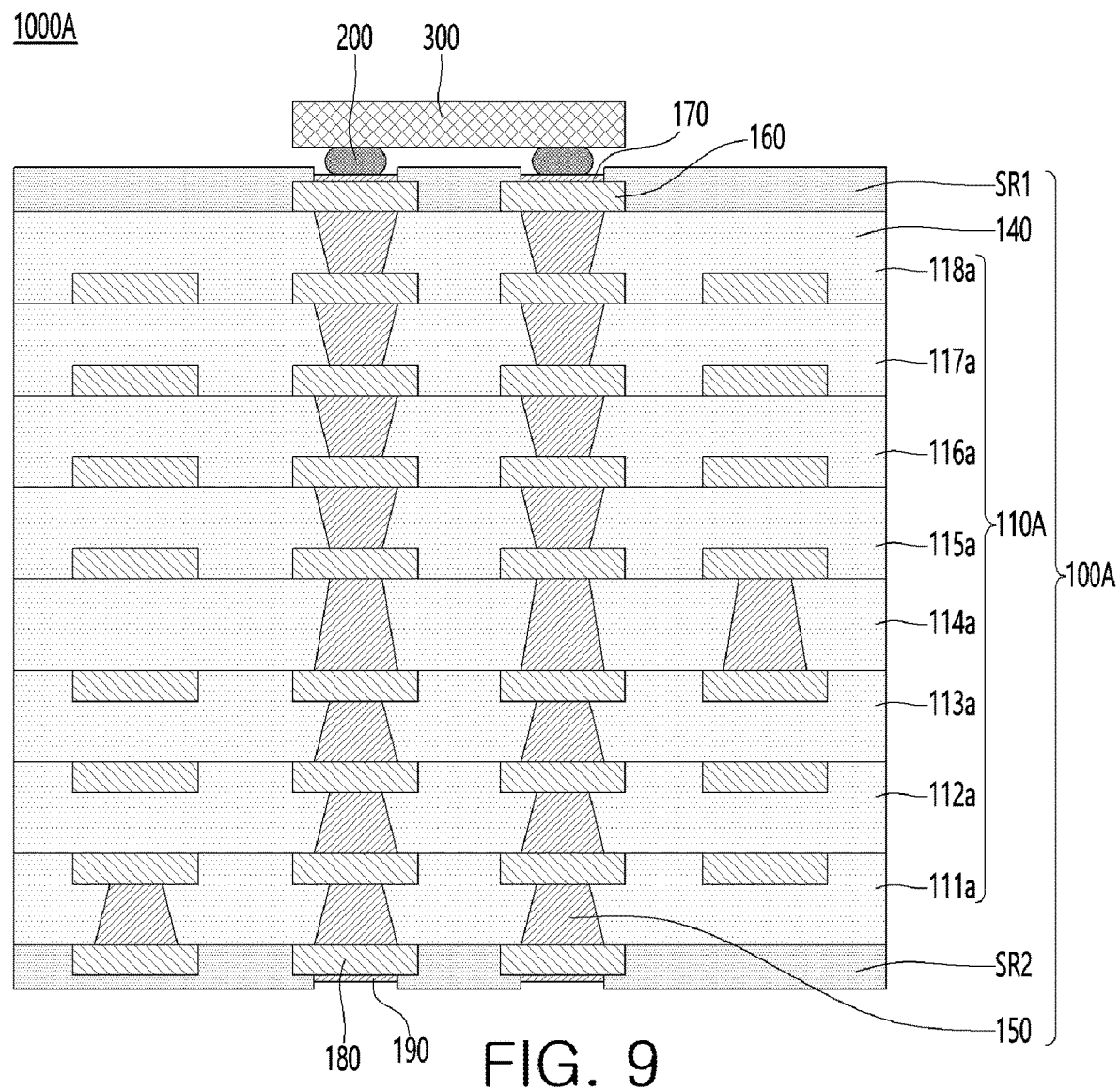
FIG. 9 is a view showing a cross-sectional view of a circuit board according to the second embodiment.
Figure 10:
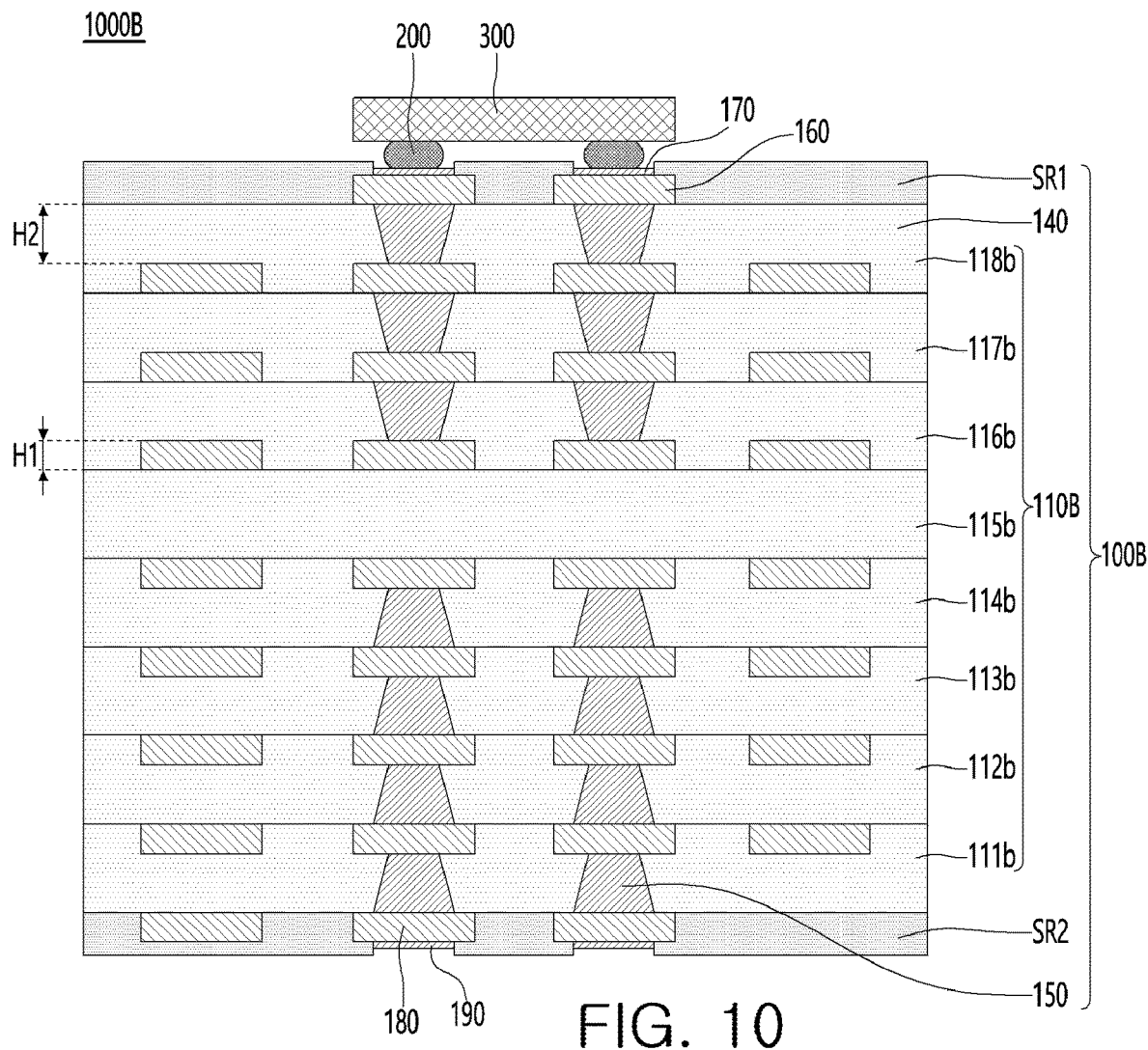
FIG. 10 is a view showing a cross-sectional view of a circuit board according to a third embodiment.

Referring to FIG. 1, a circuit board 1000 according to the first embodiment may be included an insulating substrate 100, a first pad 160, a first upper metal layer 170, a second pad 180, and a second upper metal layer. 190, a first protective layer SR1, a second protective layer SR2, a solder paste 200, and an electronic component 300 (herein, the first upper metal layer 170, the second The pad 180 and the second upper metal layer 190 are shown in FIGS. 9 and 10).

The insulating substrate 100 may have a flat plate structure. The insulating substrate 100 may be a printed circuit board (PCB). Here, the insulating substrate 100 may be implemented as a single substrate, or alternatively, may be implemented as a multilayer substrate in which a plurality of insulating layers are sequentially stacked.

Accordingly, the insulating substrate 100 may include a plurality of insulating portions 110, 120, 130. As shown in FIG. 1, the plurality of insulating portions includes the first insulating portion 110, a second insulating portion 120 disposed on the first insulating portion 110, and a third insulating portion 130 disposed below the first insulating portion 110.

In this case, the first insulating portion 110, the second insulating portion 120, and the third insulating portion 130 may be formed of different insulating materials. Preferably, the first insulating portion 110 may include glass fiber. Also, unlike the first insulating portion 110, the second insulating portion 120 and the third insulating portion 130 may not include the glass fiber.

Accordingly, a thickness of each insulating layer constituting the first insulating portion 110 may be different from a thickness of each insulating layer constituting the second insulating portion 120 and the third insulating portion 130. In other words, the thickness of each insulating layer constituting the first insulating portion 110 may be greater than the thickness of each insulating layer constituting the second insulating portion 120 and the third insulating portion 130.

That is, the first insulating portion 110 includes glass fibers. The glass fiber generally has a thickness of about 12 µm. Accordingly, the thickness of each insulating layer constituting the first insulating portion 110 may have a thickness of 21 µm±2 µm including the thickness of the glass fiber. Specifically, the thickness of each insulating layer included in the first insulating portion 110 may be in a range of 19 µm to 23 µm.

Unlike this, the glass fiber is not included in the second insulating portion 120. Preferably, each insulating layer constituting the second insulating portion 120 may be composed of RCC. Accordingly, each insulating layer constituting the second insulating portion 120 may have a thickness of 12 µm±2 µm. That is, the thickness of each insulating layer constituting the second insulating portion 120 may be in a range of 10 µm to 14 µm.

In addition, the glass fiber is not included in the third insulating portion 130. Preferably, each insulating layer constituting the third insulating portion 130 may be composed of RCC. Accordingly, each insulating layer constituting the third insulating portion 130 may have a thickness of 12 µm±2 µm. That is, the thickness of each insulating layer constituting the third insulating portion 130 may be in a range of 10 µm to 14 µm.

That is, the insulating portion constituting the circuit board in a comparative example includes a plurality of insulating layers, and the plurality of insulating layers are composed of a prepreg (PPG) including glass fibers. In this case, it is difficult to reduce the thickness of the glass fiber based on the PPG of the circuit board in the comparative example. This is because, when the thickness of the PPG is reduced, the glass fibers included in the PPG may be electrically connected to a circuit pattern disposed on the surface of the PPG, and thus a crack list is induced. Accordingly, in the case of reducing the thickness of the PPG of the circuit board in the comparative example, dielectric breakdown and damage to the circuit pattern may occur. Accordingly, the circuit board in the comparative example had a limit in reducing the overall thickness due to the thickness of the glass fibers constituting the PPG.

Moreover, since the circuit board in the comparative example is comprised with the insulating layer only of PPG containing glass fiber, it has a high dielectric constant. However, in the case of a dielectric having a high dielectric constant, there is a problem in that it is difficult to access it as a substitute for a high frequency. That is, in the circuit board of the comparative example, since the dielectric constant of the glass fiber is high, the dielectric constant is broken in the high frequency band.

Accordingly, in the embodiment, the insulating layer is formed using the RCC having a low dielectric constant, thereby reducing the thickness of the circuit board and providing a highly reliable circuit board in which signal loss is minimized even in a high frequency band. This may be achieved by properties of materials in each insulating layer constituting the second insulating portion 120 and the third insulating portion 130, which will be described in more detail below.

The first insulating portion 110 may include a first insulating layer 111, a second insulating layer 112, a third insulating layer 113, and a fourth insulating layer 114 from a bottom portion. In addition, each of the first insulating layer 111, the second insulating layer 112, the third insulating layer 113, and the fourth insulating layer 114 may be made of PPG including glass fibers.

In addition, the second insulating portion 120 may include a fifth insulating layer 121 and a sixth insulating layer 122 from a bottom portion. The fifth insulating layer 121 and the sixth insulating layer 122 constituting the second insulating portion 120 may be formed of RCC having a low dielectric constant and a low coefficient of thermal expansion.

In addition, the third insulating portion 130 may include a seventh insulating layer 131 and an eighth insulating layer 132 from a top portion. The seventh insulating layer 131 and the eighth insulating layer 132 constituting the third insulating portion 130 may be formed of RCC having a low dielectric constant and a low coefficient of thermal expansion.

Meanwhile, although the first insulating portion 110 has been illustrated as having a four-layer insulating layer structure in the above, it is not limited thereto, and the number of insulating layers constituting the first insulating portion 110 may increase or decrease.

In addition, although the second insulating portion 120 and the third insulating portion 130 have been illustrated as having an insulating layer structure of two layers, the present invention is not limited thereto, and the number of insulating layers constituting the second insulating portion 120 and the third insulating portion 130 may increase.

As described above, the circuit board according to the first embodiment includes the first insulating portion 110, the second insulating portion 120, and the third insulating portion 130, and the first insulating portion 110 may be made of PPG including glass fiber, and the second insulating portion 120 and the third insulating portion 130 may be formed of RCC having a low dielectric constant for use in a circuit board applied to a high frequency application. In addition, the second insulating portion 120 and the third insulating portion 130 may have a low dielectric constant and at the same time secure mechanical/chemical safety, thereby improving the reliability of the circuit board.

The insulating layer constituting the second insulating portion 120 and the third insulating portion 130 will be described in detail below.

Meanwhile, a circuit pattern 140 may be disposed on a surface of the insulating layer constituting each of the first insulating portion 110, the second insulating portion 120, and the third insulating portion 130.

Preferably, a circuit pattern 140 may be disposed on at least one surface of each of the first insulating layer 111, the second insulating layer 112, the third insulating layer 113, the fourth insulating layer 114, the fifth insulating layer 121, the sixth insulating layer 122, the seventh insulating layer 131 and the eighth insulating layer 132.

The circuit pattern 140 is a wire that transmits an electrical signal, and may be formed of a metal material having high electrical conductivity. To this end, the circuit pattern 140 may be formed of at least one metal material selected from gold (Au), silver (Ag), platinum (Pt), titanium (Ti), tin (Sn), copper (Cu), and zinc (Zn).

In addition, the circuit pattern 140 may be formed of a paste or solder paste including at least one metal material selected from among gold (Au), silver (Ag), platinum (Pt), titanium (Ti), tin (Sn), copper (Cu), and zinc (Zn) having excellent bonding strength. Preferably, the circuit pattern 140 may be formed of copper (Cu), which has high electrical conductivity and is relatively inexpensive.

In addition, the circuit pattern 140 may have a thickness of 12 µm±2 µm. That is, the thickness of the circuit pattern may be in a range of 10 µm to 14 µm.

The circuit pattern 140 may be formed using additive process, subtractive process, MSAP (Modified Semi Additive Process), and SAP (Semi Additive Process) method, which is a typical printed circuit board manufacturing process possible, and a detailed description thereof will be omitted herein.

Meanwhile, a buffer layer 400 may be disposed on each of the insulating layers constituting the first insulating portion 110, the second insulating portion 120, and the third insulating portion 130 and/or on the surface of the circuit pattern 140. In detail, the buffer layer 400 may be disposed on the surface of at least one of top, bottom, and side surfaces of the circuit pattern 140 or on the surface of the insulating layer on which the circuit pattern is disposed.

The buffer layer formed on the insulating layer or the circuit pattern will be described in detail below.

At least one via 150 is formed in at least one of the plurality of insulating layers constituting the first insulating portion 110, the second insulating portion 120, and the third insulating portion 130. The via 150 is disposed to pass through at least one insulating layer among the plurality of insulating layers. The via 150 may pass through only one insulating layer among the plurality of insulating layers. Alternatively, the via 150 may be formed while passing through at least two insulating layers among the plurality of insulating layers in common. Accordingly, the via 150 electrically connects the circuit patterns disposed on the surfaces of different insulating layers to each other.

The via 150 may be formed by filling an inside of a through hole (not shown) passing through at least one insulating layer among the plurality of insulating layers with a conductive material.

When the through hole is formed by mechanical processing, methods such as milling, drilling, and routing may be used, and when the through hole is formed by laser processing, a UV or $CO_2$ laser method may be used, and when the through hole is formed by chemical processing, drugs containing aminosilane, ketones, etc. may be used, and the like, thereby the first insulating layer 110 may be opened.

On the other hand, the processing by the laser is a cutting method that takes the desired shape to melt and evaporate a part of the material by concentrating optical energy on the surface, it can easily process complex formations by computer programs, and can process composite materials that are difficult to cut by other methods.

In addition, the processing by the laser can have a cutting diameter of at least 0.005 mm, and has a wide advantage in a range of possible thicknesses.

As the laser processing drill, it is preferable to use a YAG (Yttrium Aluminum Garnet) laser, a $CO_2$ laser, or an ultraviolet (UV) laser. The YAG laser is a laser that can process both the copper foil layer and the insulating layer, and the $CO_2$ laser is a laser that can process only the insulating layer.

When the through hole is formed, the via 150 is formed by filling the inside of the through hole with a conductive material. The metal material forming the via 150 may be any one material selected from copper (Cu), silver (Ag), tin (Sn), gold (Au), nickel (Ni), and palladium (Pd), and the conductive material may be filled using any one or a combination of electroless plating, electrolytic plating, screen printing, sputtering, evaporation, inkjetting and dispensing.

A first pad 160 is disposed on an uppermost insulating layer among the plurality of insulating layers (specifically, the sixth insulating layer 122 constituting the second insulating portion 120), and the second pad 180 is disposed under a lowermost insulating layer among the plurality of insulating layers (specifically, the eighth insulating layer 132 constituting the third insulating portion 130).

In other words, the first pad 160 is disposed on the uppermost insulating layer on which the electronic component 300 is to be disposed among the plurality of insulating layers. A plurality of first pads 160 may be formed on the uppermost insulating layer. In addition, a part of the first pad 160 may serve as a pattern for signal transmission, and another part may serve as an inner lead electrically connected to the electronic component 300 through a wire or the like. In other words, the first pad 160 may include a wire bonding pad for wire bonding.

In addition, the second pad 180 is disposed under the lowermost insulating layer to which an external substrate (not shown) is to be attached among the plurality of insulating layers. Like the first pad 160, a part of the second pad 180 also serves as a pattern for signal transmission, and another part of the second pad 180 is an outer lead on which an adhesive member (not shown) is disposed for attachment of the external substrate. In other words, the second pad 180 may include a soldering pad for a soldering purpose.

In addition, the first upper metal layer 170 is disposed on the first pad 160, and the second upper metal layer 190 is disposed under the second pad 180. The first upper metal layer 170 and the second upper metal layer 190 are formed of the same material, respectively, while protecting the first pad 160 and the second pad 180, the wire bonding or the soldering characteristic is increased.

To this end, the first upper metal layer 170 and the second upper metal layer 190 are formed of a metal including gold (Au). Preferably, the first upper metal layer 170 and the second upper metal layer 190 may include only pure gold (purity of 99% or more), and alternatively, may be formed of an alloy containing gold (Au). When the first upper metal layer 170 and the second upper metal layer 190 are formed of an alloy containing gold, the alloy may be formed of a gold alloy containing cobalt.

A solder paste 200 is disposed on the uppermost insulating layer among the plurality of insulating layers. The solder paste is an adhesive for fixing the electronic component 300 attached to the insulating substrate 100. Accordingly, the solder paste 200 may also be referred to as an adhesive. The adhesive may be a conductive adhesive, alternatively may be a non-conductive adhesive. That is, the circuit board 100 may be a board to which the electronic component 300 is attached by a wire bonding method, and accordingly, a terminal (not shown) of the electronic component 300 may not be disposed on the adhesive. Also, the adhesive may not be electrically connected to the electronic component 300. Accordingly, the adhesive may use a non-conductive adhesive, or alternatively, a conductive adhesive may be used.

The conductive adhesive is broadly divided into an anisotropic conductive adhesive and an isotropic conductive adhesive, and basically composed conductive particles such as Ni, Au/polymer, or Ag, and thermosetting, thermoplastic, or a blend type insulating resin that mixes the characteristics of both.

In addition, the non-conductive adhesive may be a polymer adhesive, preferably a non-conductive polymer adhesive including a thermosetting resin, a thermoplastic resin, a filler, a curing agent, and a curing accelerator.

In addition, a first protective layer SR1 exposing at least a part of the surface of the first upper metal layer 170 is disposed on the uppermost insulating layer. The first protective layer SR1 is disposed to protect the surface of the uppermost insulating layer, and for example, it may be a solder resist.

In addition, the solder paste 200 is disposed on the first upper metal layer 170, and accordingly, the first pad 160 and the electronic component 300 may be electrically connected to each other.

Here, the electronic component 300 may include both devices and chips. The device may be divided into an active device and a passive device, and the active device is a device that actively uses a non-linear portion, and the passive device refers to a device that does not use the non-linear characteristic even though both linear and non-linear characteristics exist. In addition, the passive device may include a transistor, an IC semiconductor chip, and the like, and the passive device may include a capacitor, a resistor, an inductor, and the like. The passive device is mounted on a general printed circuit board to increase a signal processing speed of a semiconductor chip, which is an active device, or to perform a filtering function.

Consequently, the electronic component 300 may include all of a semiconductor chip, a light emitting diode chip, and other driving chips.

A resin molding portion may be formed on the uppermost insulating layer, and accordingly, the electronic component 300 and the first upper metal layer 170 may be protected by the resin molding portion.

Meanwhile, a second protective layer SR2 is disposed under the lowermost insulating layer among the plurality of insulating layers. The second protective layer SR2 has an opening exposing the surface of the second upper metal layer 190. The second protective layer SR2 may be formed of a solder resist.

As described above, a buffer layer may be disposed on at least one surface of the insulating layer or the circuit pattern 140.

In detail, the buffer layer 400 may be disposed between the insulating layer and the circuit pattern 140 in a region where the insulating layer and the circuit pattern 140 overlap.

The buffer layer 400 may be a surface treatment layer treated on the surface of the insulating layer. The buffer layer 400 may be a surface treatment layer treated on the surface of the circuit pattern 140.

The buffer layer 400 may be an intermediate layer disposed between the insulating layer and the circuit pattern. The buffer layer 400 may be a coating layer disposed between the insulating layer and the circuit pattern. The buffer layer 400 may be a functional layer that improves adhesion between the insulating layer and the circuit pattern, that is, an adhesion strengthening layer.

FIGS. 2 to 5 are views for explaining the position and arrangement relationship of the buffer layer 400. Hereinafter, a position and arrangement relationship of the buffer layer 400 disposed on the insulating layer constituting the first insulating portion 110 among the plurality of insulating portions will be described. However, the buffer layer 400 may also be disposed on the insulating layer constituting the second insulating portion 120 and the third insulating portion 130 to correspond to the position and arrangement relationship described below.

Figure 2:
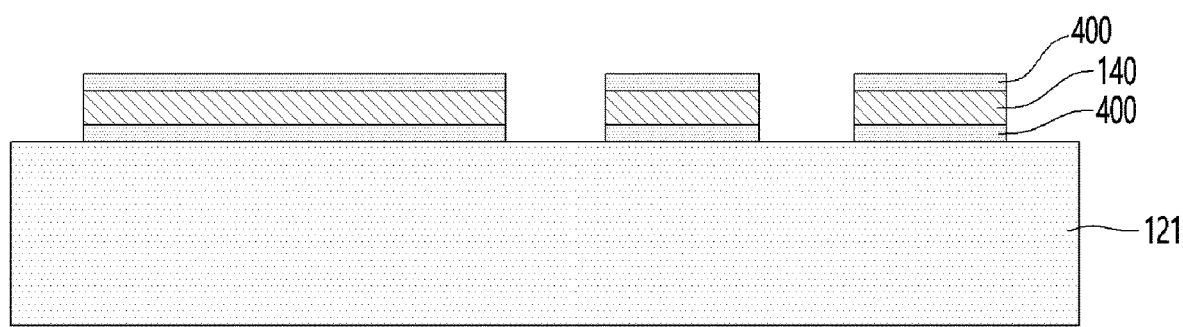
FIGS. 2 to 5 are views for explaining an arrangement relationship of a buffer layer of the circuit board according to the embodiment.

Referring to FIG. 2, the buffer layer 400 may be disposed on the surface of the circuit pattern. For example, the buffer layer 400 may be disposed on an upper surface and a lower surface of the circuit pattern. That is, the buffer layer 400 may be disposed on a surface that contacts or faces the insulating layer among the surfaces of the circuit pattern.

Figure 3:
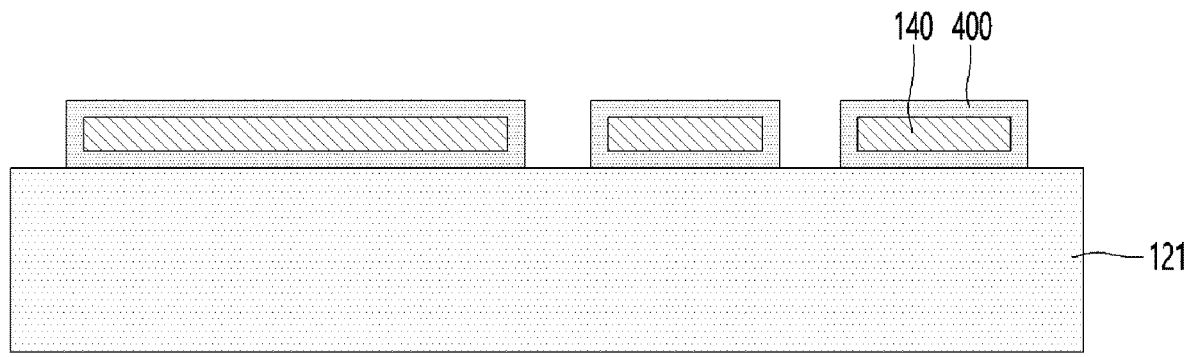

Alternatively, referring to FIG. 3, the buffer layer 400 may be disposed on the surface of the circuit pattern. For example, the buffer layer 400 may be disposed on an upper surface, a lower surface, and both sides of the circuit pattern. That is, the buffer layer 400 may be disposed to surround the entire surface of the circuit pattern.

Figure 4:
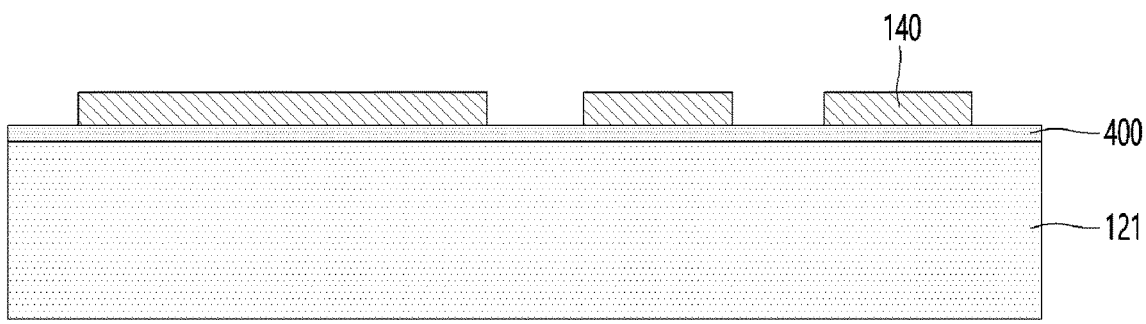

Alternatively, referring to FIG. 4, the buffer layer 400 may be disposed on the surface of the insulating layer. For example, the buffer layer 400 may be disposed on an upper surface and a lower surface of the insulating layer. That is, the buffer layer 400 may be disposed on a surface of the insulating layer that contacts or faces the circuit pattern 140. That is, the buffer layer 400 may be disposed on the entire surface of the insulating layer on which the circuit pattern 140 is disposed.

Figure 5:
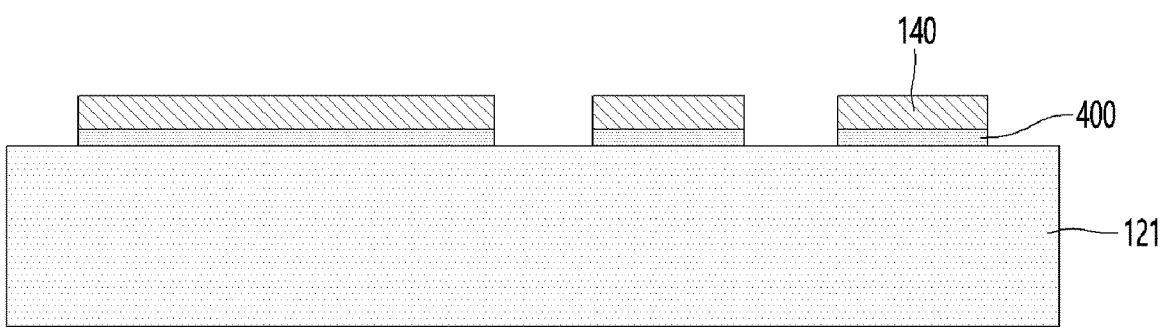
Figure 6:
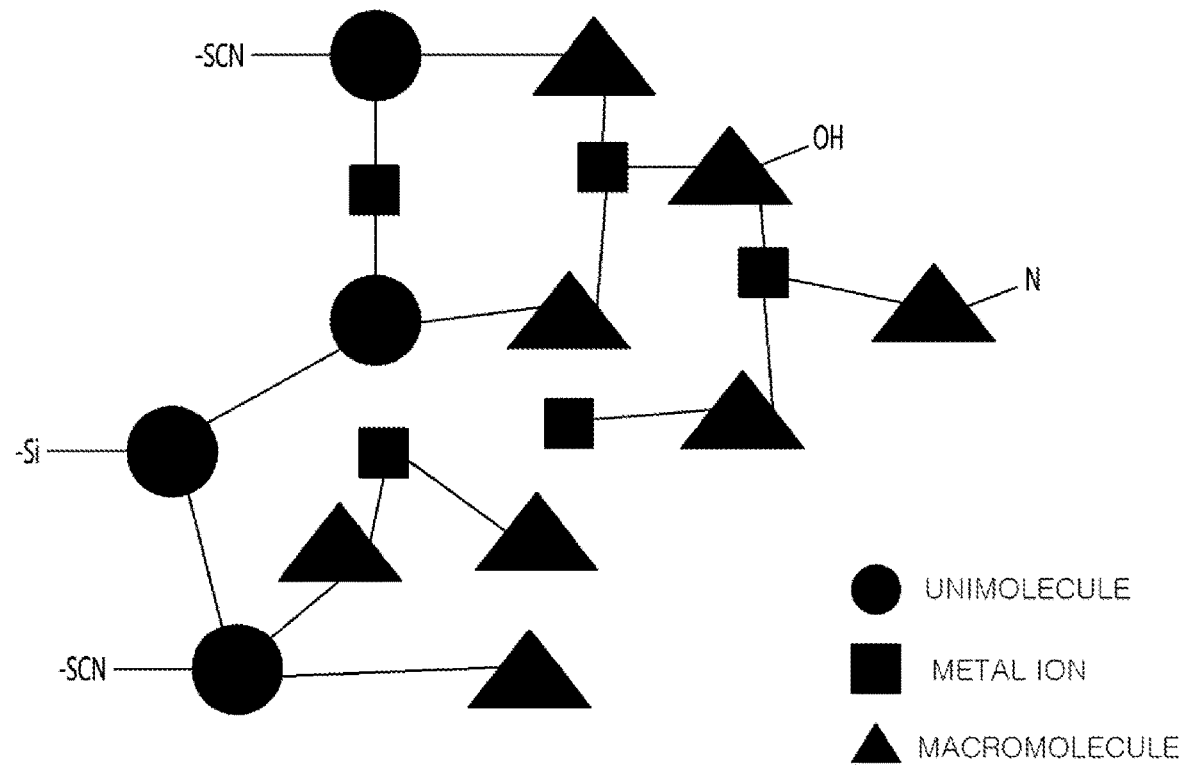
FIG. 6 is a view showing a simplified structural formula of a buffer layer of a circuit board according to the embodiment.

Alternatively, referring to FIG. 5, the buffer layer 400 may be disposed on the surface of the insulating layer. For example, the buffer layer 400 may be disposed on an upper surface and a lower surface of the insulating layer. That is, the buffer layer 400 may be disposed on a surface of the insulating layer that contacts or faces the circuit pattern 140. That is, the buffer layer 400 may be disposed only in a region where the circuit pattern 140 is disposed on the surface of the insulating layer on which the circuit pattern 140 is disposed.

That is, the buffer layer 400 may be disposed between the insulating layer and the circuit pattern 140. In detail, the buffer layer 400 may be disposed between the insulating layer and the circuit pattern 140, and the buffer layer 400 may be coupled to one surface of the insulating layer and one surface of the circuit pattern 140. That is, a terminal group of the buffer layer and the terminal group of the insulating layer, and the terminal group of the buffer layer and the terminal group of the circuit pattern may be chemically bonded.

The buffer layer 400 may be formed to have a constant thickness. In detail, the buffer layer 400 may be formed as a thin film. In detail, the buffer layer 400 may be formed to a thickness of 500 nm or less. In more detail, the buffer layer 400 may be formed to a thickness of 5 nm to 500 nm.

When the thickness of the buffer layer 400 is formed to be 5 nm or less, the thickness of the buffer layer is too thin to sufficiently secure adhesion between the insulating layer and the circuit pattern, and when the thickness of the buffer layer is formed to exceed 500 nm, the effect of improving adhesion according to the thickness is insignificant, the overall thickness of the circuit board may be increased, and the dielectric constant of the insulating layer may increase, so that the transmission loss of the circuit board may increase in high frequency applications.

The buffer layer 400 may include a plurality of elements. A plurality of elements included in the buffer layer 400 are combined with each other in the buffer layer and included in molecular or ionic form, and the molecules, the molecules, and the ions may be chemically bonded to each other to form a buffer layer.

The buffer layer 400 may include at least one of a carbon element, a nitrogen element, an oxygen element, a silicon element, a sulfur element, and a metal element. In detail, the buffer layer 400 may include all of a carbon element, a nitrogen element, an oxygen element, a silicon element, a sulfur element, and a metal element.

The carbon element, nitrogen element, oxygen element, silicon element, sulfur element, and metal element may be present in a molecular form by bonding to each other in the buffer layer, or may exist in an ionic form alone.

Among the plurality of elements, the oxygen element, the carbon element, and the nitrogen element may be related to a functional group of the buffer layer coupled to the insulating layer. That is, a functional group formed by molecules including the oxygen element, the carbon element, the nitrogen atom, and the like may be chemically bonded to the insulating layer.

In addition, the carbon element, the nitrogen element, the silicon element, and the sulfur element among the plurality of elements may be related to a functional group of the buffer layer coupled to the circuit pattern. That is, a functional group formed by molecules including the carbon element, the nitrogen element, the silicon element, the sulfur element, etc. may be chemically bonded to the circuit pattern.

In addition, the metal element may combine molecules formed by the carbon element, nitrogen element, oxygen element, silicon element, and sulfur element to each other. That is, molecules formed by the carbon element, nitrogen element, oxygen element, silicon element, and sulfur element may be chemically combined through the metal element to form a buffer layer. That is, the metal element may be disposed between the molecules to serve as a medium for chemically bonding the molecules.

To this end, the carbon element, nitrogen element, oxygen element, silicon element, sulfur element, and metal element may be included in a constant mass ratio. In detail, the metal element among the plurality of elements may be included the most than other elements, and the carbon element, nitrogen element, oxygen element, silicon element, and sulfur element may each be included in a constant mass ratio based on the metal element.

Specifically, the ratio of the carbon element to the metal element ((carbon element/copper element)*100) may be 5 to 7, In addition, the ratio of the nitrogen element to the metal element ((nitrogen element/copper element)*100) may be 1.5 to 7.

In addition, the ratio of the oxygen element to the metal element ((oxygen element/copper element)*100) may be 1.1 to 1.9.

In addition, the ratio of the silicon element to the metal element ((silicon element/copper element)*100) may be 0.5 to 0.9.

In addition, the ratio of the sulfur element to the metal element ((sulfur element/copper element)*100) may be 0.5 to 1.5.

A ratio of the carbon element, nitrogen element, oxygen element, silicon element, and sulfur element to the metal element may be related to a bonding strength of the insulating layer or the circuit board.

In detail, when the ratio of the carbon element to the metal element ((carbon element/copper element)*100) is out of the range of 5 to 7, the bonding force between the buffer layer and the circuit board or the buffer layer and the insulating layer may be weakened.

In addition, when the ratio of the nitrogen element to the metal element ((nitrogen element/copper element)*100) is out of the range of 1.5 to 7, the bonding force between the buffer layer and the circuit board or the buffer layer and the insulating layer may be weakened. have.

Also, when the ratio of the oxygen element to the metal element ((oxygen element/copper element)*100) is out of the range of 1.1 to 1.9, the bonding force between the buffer layer and the insulating layer may be weakened.

In addition, when the ratio of the silicon element to the metal element ((silicon element/copper element)*100) is out of the range of 0.5 to 0.9, the bonding force between the buffer layer and the circuit board may be weakened.

In addition, when the ratio of the sulfur element to the metal element ((sulfur element sulfur/copper element)*100) is out of the range of 0.5 to 1.5, the bonding force between the buffer layer and the circuit board may be weakened.

Meanwhile, the carbon element, nitrogen element, oxygen element, silicon element, sulfur element, and metal element exist in the form of molecules or ions in the buffer layer, and the molecules and the ions may be connected to each other by bonding.

In detail, the buffer layer 400 may include molecules and metal ions formed by the carbon element, nitrogen element, oxygen element, silicon element, sulfur element, and metal elements. The molecules included in the buffer layer 400 may include at least two types of molecules depending on the size of the molecule or the size of the molecular weight. In detail, the molecule may include macromolecule and unimolecule.

The macromolecule, the unimolecule, and the metal ion may be formed in a structure in which they are bonded to each other in the buffer layer.

In detail, the macromolecule, the unimolecule, and the metal ion may be chemically bonded through covalent bonds and coordination bonds in the buffer layer to form a structure in which they are connected to each other.

The metal ion may connect the macromolecules, the unimolecules, or the macromolecule and the unimolecules to each other. In detail, the macro molecules, the unimolecules, or the macromolecule and the unimolecule are coordinate bonded with the metal ion, and accordingly, the macromolecules, the unimolecule, or the macromolecule and the unimolecule can be chemically bound.

The metal ions may include the same material as the circuit pattern. Alternatively, the metal ion may include a material different from that of the circuit pattern. For example, when the circuit pattern includes copper, the metal ions may include copper or a metal other than copper.

In detail, the metal ions may be formed by the circuit pattern. In detail, metal ions may be formed by ionizing the circuit pattern including metal using a separate oxidizing agent. Accordingly, the ionized metal ions may form a buffer layer by coordinating the macro molecules and the unimolecules in the buffer layer to connect the molecules to each other.

Alternatively, a metal ion may be separately added when the buffer layer is formed, and the metal ion may form a buffer layer by coordinating the macro molecule and the single molecule in the buffer layer to connect the molecules to each other. In this case, the separately added metal ions may be the same as or different from the metal of the circuit pattern.

The macromolecule and the unimolecule may include at least one of the carbon element, nitrogen element, oxygen element, silicon element, and sulfur element.

That is, the macromolecule and the unimolecule may be molecules including at least one of the carbon element, nitrogen element, oxygen element, silicon element, and sulfur element.

In detail, the macromolecule may include a molecule including the carbon element and the nitrogen element. In detail, the macromolecule may include an azole group including the carbon element and the nitrogen element.

In addition, the macromolecule may include a molecule including the silicon element. In detail, the macro molecule may include a silane group including the silicon element.

In addition, the unimolecule may include the carbon element, the nitrogen element, and the sulfur element. That is, the unimolecule may be a molecule including the carbon element, the nitrogen element, and the sulfur element. For example, the unimolecule may include an SCN group to which a thiocyanate group (—SCN) is connected.

Referring to FIG. 3, the buffer layer 400 may include a plurality of functional groups. In detail, the buffer layer 400 may include a first functional group chemically bonded to the insulating layer and a second functional group chemically bonded to the circuit pattern 140.

That is, the macromolecule and the unimolecules may include a plurality of terminal groups, ie, functional groups, chemically bonded to the insulating layer and the circuit pattern. By these functional groups, the insulating layer and the circuit pattern are chemically tightly coupled by the buffer layer, so that adhesion between the insulating layer and the circuit pattern can be improved.

The first functional group and the second functional group may be defined as terminal groups of the buffer layer connected to one of the macromolecule, the mono atom, or the metal atom.

The first functional group may be bonded to the insulating layer by a covalent bond. The first functional group may include functional groups covalently bonded to the insulating layer. In detail, the first functional group may include a hydroxyl group (—OH) and an N group of the azole group.

In addition, the second functional group may be coupled to the circuit pattern 140 by coordination bonding. The second functional group may include functional groups coordinated with the circuit pattern 140. In detail, the second functional group may include a Si group and a thiocyanate group (—SCN) of a silane group.

The first functional group and the second functional group included in the buffer layer may be chemically bonded to the insulating layer and the circuit pattern, respectively. Accordingly, by the buffer layer disposed between the insulating layer and the circuit pattern, adhesion between the insulating layer, which is a dissimilar material, and the circuit pattern may be improved.

Meanwhile, as described above, the insulating layer constituting the second insulating portion 120 and the third insulating portion 130 may include a material capable of securing mechanical/chemical reliability with a low dielectric constant.

In detail, the insulating layers 121, 122, 131, and 132 may have a dielectric constant Dk of 3.0 or less. In more detail, the insulating layers 121, 122, 131, and 132 may have a dielectric constant of 2.03 to 2.7. Accordingly, the insulating layer may have a low dielectric constant, and when the insulating layer is applied to a circuit board for high frequency use, transmission loss according to the dielectric constant of the insulating layer may be reduced.

In addition, the insulating layers 121, 122, 131, and 132 may have a coefficient of thermal expansion of 50 ppm/° C. or less. In detail, the insulating layers 121, 122, 131, and 132 may have a coefficient of thermal expansion of 15 ppm/° C. to 50 ppm/° C.

Accordingly, the insulating layers 121, 122, 131, and 132 may have a low coefficient of thermal expansion, thereby minimizing cracks in the insulating layer due to temperature change.

To this end, the insulating layers 121, 122, 131, and 132 may be formed of two materials. In detail, the insulating layers 121, 122, 131, and 132 may include a material in which two compounds are mixed. In detail, the insulating layers 121, 122, 131, and 132 may include a first compound and a second compound.

The first material and the second material may be included in a certain ratio range. In detail, the first material and the second material may be included in a ratio of 4:6 to 6:4.

In addition, the insulating layers 121, 122, 131, and 132 may further include inorganic particles. In detail, the insulating layers 121, 122, 131, and 132 may further include inorganic particles such as silicon dioxide ($SiO_2$). The inorganic particles may be included in an amount of about 55 wt % to about 70 wt % based on the entire insulating layer 121, 122, 131, 132.

When the ratio of the inorganic particles is out of the above range, the coefficient of thermal expansion or the dielectric constant may be increased by the inorganic particles, and thus properties of the insulating layer may be deteriorated.

Also, the first material and the second material may be chemically non-bonded with each other in the insulating layers 121, 122, 131 and 132. However, embodiments are not limited thereto, and the first material including the first compound and the second material including the second compound may be chemically bonded directly or through a separate linking group.

The first material may include a material having an insulating property. In addition, the first material may have improved mechanical properties due to high impact strength. In detail, the first material may include a resin material. For example, the first material may include a first compound including polyphenyl ether (PPE).

The first material may include a plurality of the first compounds, and the first compounds may be formed by chemically bonding with each other. In detail, the first compound may be linearly connected to each other by a covalent bond, that is, a pi-pi bond ($\pi$-$\pi$).

That is, the first compounds may be formed by chemically bonding with each other so that the first material has a molecular weight of about 300 to 500.

In addition, the second material may include a second compound. In detail, the second material may be formed by chemically bonding a plurality of second compounds to each other.

The second compound may include a material having a low dielectric constant and a coefficient of thermal expansion. In addition, the second compound may include a material having improved mechanical strength.

The second compound may include tricyclodecane and a terminal group connected to the tricyclodecane. The terminal group connected to the tricyclodecane may include various materials in which the second compounds may be connected to each other by a carbon double bond (C=C bonding). In detail, the terminal group connected to the tricyclodecane may include an acrylate group, an epoxide group, a carboxyl group, a hydroxyl group, and an isocyanate group.

The second compounds may be linked to each other between the terminal groups connected to the tricyclodecane. Specifically, the second compounds are cross-linked between the terminal groups by a carbon double bond (C=C bonding) to form a network structure.

Figure 7:
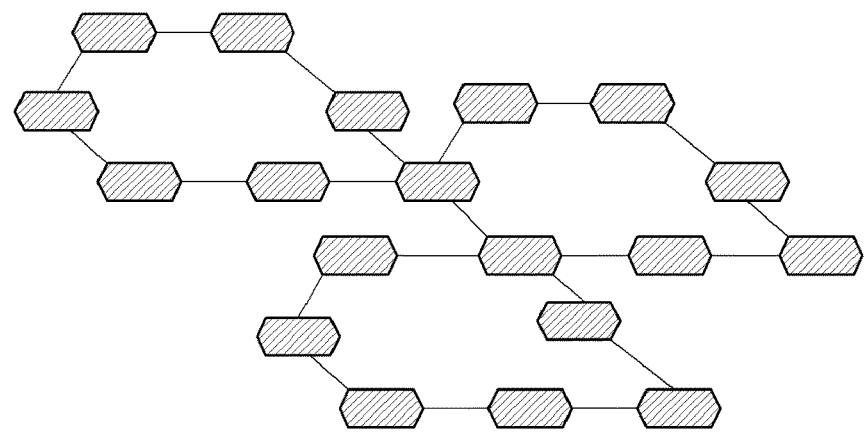
FIG. 7 is a view showing a structure of a second material included in an insulating layer of a circuit board according to an embodiment.

Specifically, referring to FIG. 7, the second compounds may be cross-linked to form a network structure. That is, the second compounds may be an aggregate of bonds having a plurality of network structures.

Accordingly, the second material formed by the second compounds may have a low dielectric constant and a low coefficient of thermal expansion according to material properties, and may have improved mechanical strength due to the network structure.

Figure 8:
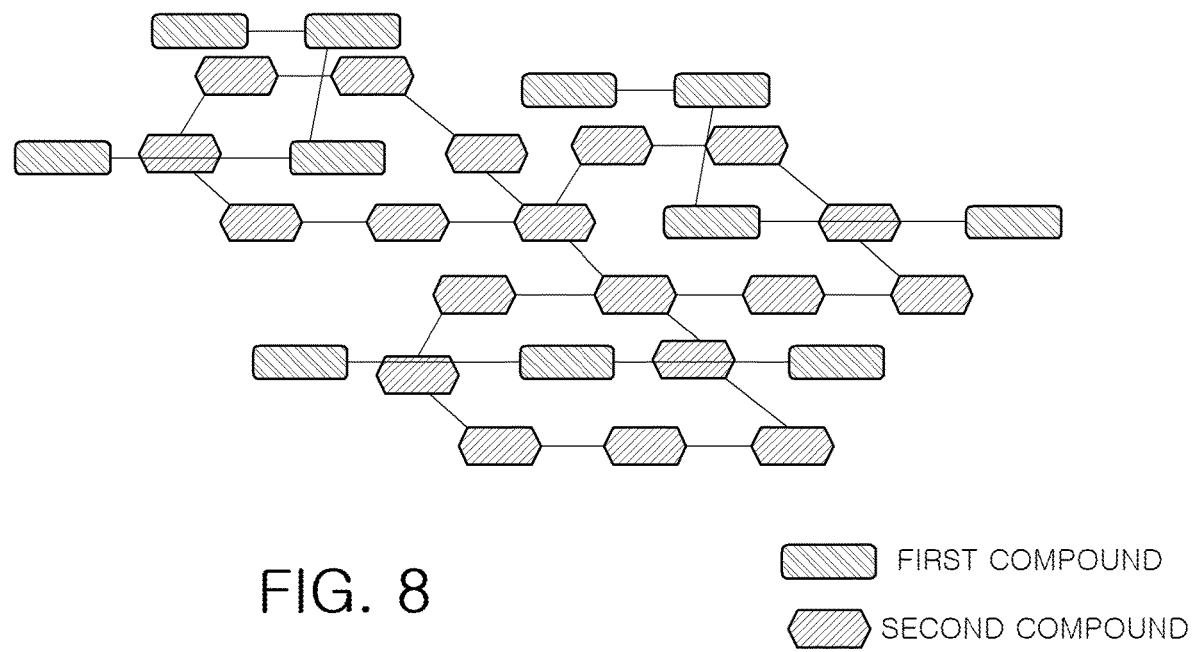
FIG. 8 is a view for explaining an arrangement structure of a first material and a second material included in an insulating layer of a circuit board according to an embodiment.

FIG. 8 is a view for explaining an arrangement of the first material and the second material constituting the insulating layer.

The first material and the second material may be formed as one single phase in the insulating layer. Referring to FIG. 8, the first material connected by the covalent bond of the first compound may be disposed inside the second material formed by the second compound cross-linked to each other to form a network structure.

In detail, the first compound may be disposed inside the network structure of the second material formed by chemically bonding the second compound to prevent the first material from being separated from the second material.

That is, in the insulating layer, the first material and the second material are not disposed to be phase-separated in the insulating layer, and may be formed in a one single-phase structure. Accordingly, since the first material and the second material have a low dielectric constant and a low coefficient of thermal expansion due to material properties of the first material and the second material, they may be formed as a single phase, and thus have high mechanical strength.

On the other hand, in the first embodiment, the first insulating portion 110 is composed of an insulating layer of PPG including glass fiber, and the second insulating portion 120 and the third insulating portion 130 are made of RCC having a low dielectric constant and a low coefficient of thermal expansion as described above.

Alternatively, the circuit board may be composed of only the RCC having a low dielectric constant and a low coefficient of thermal expansion as described above.

FIG. 9 is a view showing a cross-sectional view of a circuit board according to the second embodiment.

Referring to FIG. 9, the circuit board 1000A may include an insulating substrate 100A, a first pad 160, a first upper metal layer 170, a second pad 180, a second upper metal layer 190, a first protective layer SR1, a second protective layer SR2, a solder paste 200, and an electronic component 300.

The insulating substrate 100A may include an insulating portion 110A including a plurality of insulating layers.

That is, the insulating portion 110A may include first to eighth insulating layers 111a, 112a, 113a, 114a, 115a, 116a, 117a, 118a, and 119a from a bottom portion. However, in the embodiment, the insulating portion 110A is illustrated as having an 8-layer structure, but the present invention is not limited thereto, and the number of insulating layers may increase or decrease.

In other words, the insulating portion in the first embodiment was composed of the first insulating portion of the PPG, the second insulating portion and the third insulating portion of the RCC.

Alternatively, the insulating portion in the second embodiment may be composed of only the RCC.

At this time, as described above, the insulating portion 110A in the second embodiment has a low dielectric constant and a low coefficient of thermal expansion, and accordingly, rigidity can be secured without PPG as in the first embodiment, and, even if it is composed only of RCC, it does not affect the reliability of the rigidity of the circuit board.

FIG. 10 is a view showing a cross-sectional view of a circuit board according to a third embodiment.

Referring to FIG. 10, the circuit board 1000B may include an insulating substrate 1008, a first pad 160, a first upper metal layer 170, a second pad 180, a second upper metal layer 190, and a first protective layer SR1, a second protective layer SR2, a solder paste 200, and an electronic component 300.

The insulating substrate 1008 may include an insulating portion 1108 including a plurality of insulating layers.

That is, the insulating portion 1108 may include first to eighth insulating layers 111b, 112b, 113b, 114b, 115b, 116b, 117b, 118b, and 119b from a bottom portion. However, in the embodiment, the insulating portion 1108 is illustrated as having an 8-layer structure, but the present invention is not limited thereto, and the number of insulating layers may increase or decrease.

In other words, the insulating portion in the first embodiment was composed of the first insulating portion of the PPG, the second insulating portion and the third insulating portion of the RCC.

Alternatively, the insulating portion in the third embodiment may be composed of only the RCC.

At this time, as described above, the insulating portion 1108 in the third embodiment has a low dielectric constant and a low coefficient of thermal expansion, and accordingly, rigidity can be secured without PPG as in the first embodiment, and thus even if it is composed only of RCC, it does not affect the reliability of the rigidity of the circuit board.

Here, the circuit pattern in the embodiment has low roughness and the insulating layers constituting the insulating portion 1108 have a low dielectric constant and a low coefficient of thermal expansion.

Accordingly, the thickness H2 of each of the first to eighth insulating layers 111b, 112b, 113b, 114b, 115b, 116b, 117b, 118b, and 119b constituting the insulating portion 1108 in the third embodiment may be smaller than the thickness H1 of the circuit pattern 140.

For example, the thickness H2 of the circuit pattern 140 may have a thickness of 12 μm±2 μm. That is, the thickness of each insulating layer constituting the third insulating portion 130 may be in a range of 10 μm to 14 μm.

In addition, the thickness H2 of each of the first to eighth insulating layers 111b, 112b, 113b, 114b, 115b, 116b, 117b, 118b, and 119b constituting the insulating portion 1108 is 8 μm±2 μm. That is, the thickness of each insulating layer constituting the third insulating portion 130 may be in a range of 6 μm to 10 μm.

Accordingly, the thickness of the via 150 disposed in the first to eighth insulating layers 111b, 112b, 113b, 114b, 115b, 116b, 117b, 118b, and 119b constituting the insulating portion 1108 may be smaller than the thickness of the circuit pattern 140.

Figure 11:
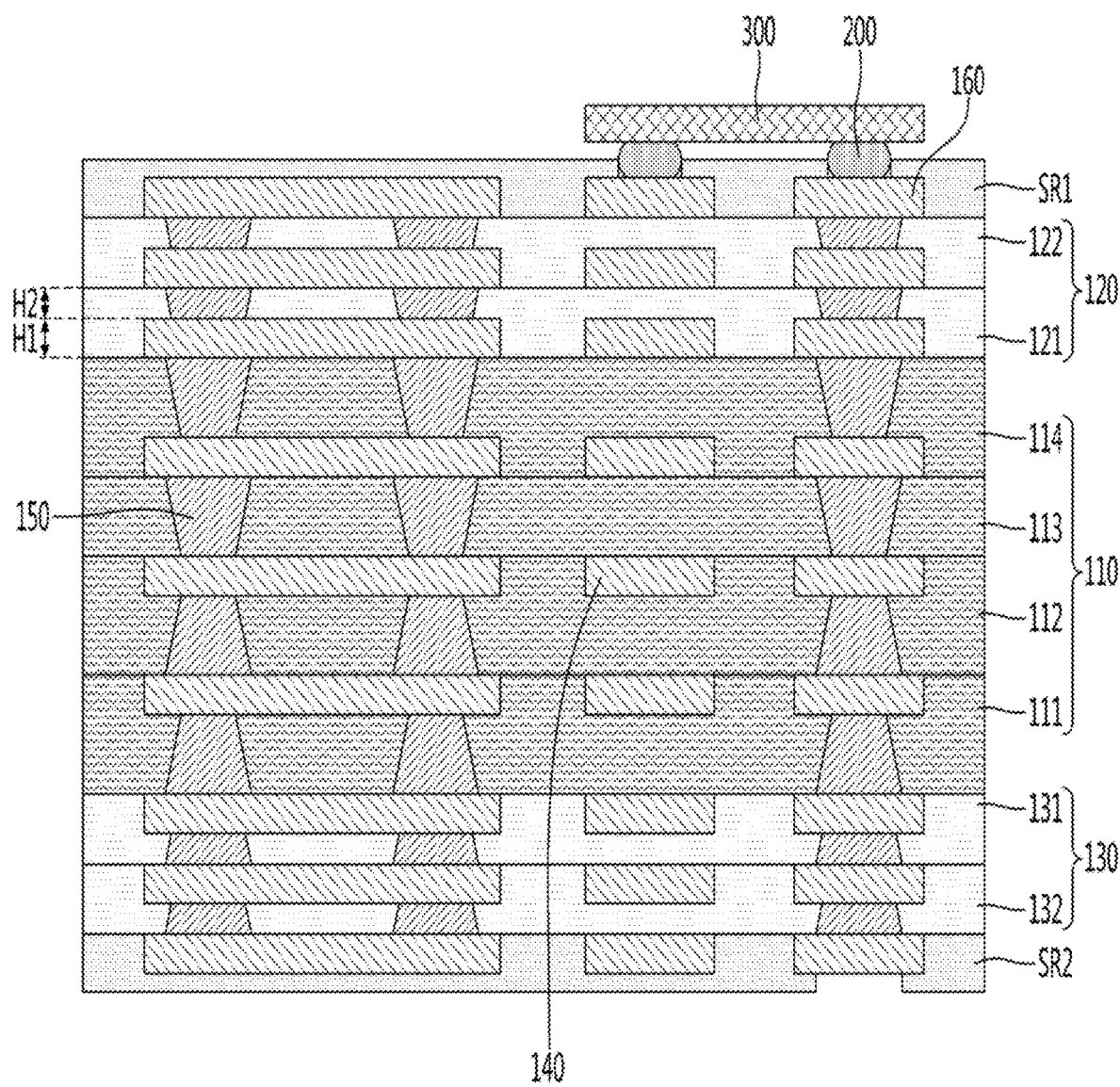

Meanwhile, referring to FIG. 11, the insulating layers constituting the second insulating portion 120 and the third insulating portion 130 in the first embodiment are also composed of the same insulating layers as in the third embodiment, and accordingly, in the first embodiment, Each of the insulating layers constituting the second insulating portion 120 and the third insulating portion 130 may have a thickness smaller than the thickness of the circuit pattern.

Hereinafter, the present invention will be described in more detail by measuring the dielectric constant according to embodiments and comparative examples that may constitute the insulating portions 110A and 1108 as in the second and third embodiments. These embodiments are merely presented as examples in order to explain the present invention in more detail. Therefore, the present invention is not limited to these examples.

Embodiment 1

A copper layer was formed on the insulating layer. At this time, after coating a coating layer containing a carbon element, a nitrogen element, an oxygen element, a silicon element, a sulfur element, and a metal element on the surface of the circuit layer in contact with the insulating layer, the copper layer and the insulating layer were adhered.

Then, the copper layer was patterned to form a circuit pattern, thereby manufacturing a circuit board.

In this case, the buffer layer included a first functional group including a hydroxyl group (—OH) and an N group of the azole group, and a second functional group including a Si group and a thiocyanate group (—SCN) of a silane group.

Next, adhesion and reliability were evaluated according to the roughness size of the circuit pattern.

Comparative Example 1

A circuit pattern was formed in the same manner as in the embodiment, except that a copper layer was formed by directly bonding a copper layer on the insulating layer without forming a coating layer on the copper layer, and a circuit pattern was formed by patterning the copper layer. And, after the forming of the circuit pattern, evaluation of adhesion and reliability according to the roughness size of the circuit pattern was performed.

Adhesion/Reliability Measurement Method

For evaluation of the adhesion of the circuit patterns according to embodiments and Comparative Examples, the UTM 90° Peel value was measured using UTM equipment.

In addition, reliability evaluation was evaluated by MG when the peel strength (kgf/cm) of the circuit pattern was less than 0.6.

TABLE 1

| roughness of circuit pattern (Ra, mm) | Embodiment 1 (peel strength, kgf/cm) | Comparative Example 1 (peel strength, kgf/cm) |
| --- | --- | --- |
| 0.1 | 0.65 | 0.37 |
| 0.2 | 0.72 | 0.41 |
| 0.3 | 0.73 | 0.45 |
| 0.4 | 0.74 | 0.52 |
| 0.5 | 0.78 | 0.60 |
| 0.6 | 0.81 | 0.67 |

TABLE 1

| roughness of circuit pattern (Ra, mm) | Embodiment 1 (reliability, peeling or not) | Comparative Example 1 (reliability, peeling or not) |
| --- | --- | --- |
| 0.1 | OK | NG |
| 0.2 | OK | NG |
| 0.3 | OK | NG |
| 0.4 | OK | NG |
| 0.5 | OK | NG |
| 0.6 | OK | OK |

Referring to Tables 1 and 2, it can be seen that the circuit board according to embodiment 1 has improved reliability compared to the circuit board according to Comparative Example 1. In detail, the circuit board according to embodiment 1 forms a circuit pattern in which a coating layer is coated on an insulating layer. Accordingly, as the coating layer is chemically tightly bonded to the insulating layer and the circuit pattern, the peel strength of the circuit pattern can be increased, and accordingly, it can be seen that the adhesion of the circuit pattern and the reliability of the circuit board can be improved. That is, it can be seen that the circuit board according to the embodiment 1 can have an adhesive force that can secure the reliability of the circuit board even when the roughness of the circuit pattern is reduced. In detail, it can be seen that the circuit board according to the embodiment 1 may have an adhesive force capable of securing the reliability of the circuit board even when the surface roughness of the circuit pattern is 0.5 or less or in the range of 0.1 to 0.5.

That is, the circuit board according to the first embodiment can reduce the illuminance of the circuit pattern when applied to high-frequency applications, and accordingly, it is possible to reduce the transmission loss due to the skin effect, and even with a low surface roughness, the reliability of the circuit pattern can be secured by improving the adhesion of the circuit pattern by the coating layer.

On the other hand, in the case of the circuit board according to Comparative Example 1, a circuit pattern is formed directly on the insulating layer. Accordingly, as the insulating layer and the circuit pattern are formed of different materials, it can be seen that the adhesive force of the circuit pattern, that is, the peel strength, is very low.

That is, it can be seen that, in the circuit board according to Comparative Example 1, reliability can be secured only when the surface roughness of the circuit pattern is increased, and when the circuit pattern has a low surface roughness, the reliability of the circuit board is reduced.

Therefore, when the circuit board according to Comparative Example 1 is applied to a high frequency application, it can be seen that the transmission loss due to the skin effect is increased due to the surface roughness of the circuit pattern.

Embodiment 2

A copper layer was formed on the insulating layer.

Then, the copper layer was patterned to form a circuit pattern, thereby manufacturing a circuit board.

At this time, the insulating was formed by putting Tricyclodecane-based di-acrylete in which an acrylate is linked to polyphenyl ether (PPE) and tricyclodecane in a toluene solvent, mixing at a temperature of about 100° C., and adding an Azo compound initiator and a peroxide initiator.

Then, by varying the frequency size, the dielectric constant, reliability, and coefficient of thermal expansion of the insulating layer according to the weight ratio of the polyphenylether (A) and tricyclodecane based di-acrylete (B) were measured.

TABLE 3

| weight ratio of A and B | Dk | | | Df | | |
| --- | --- | --- | --- | --- | --- | --- |
| | 1 GHz | 500 MHz | 100 MHz | 1 GHz | 500 MHz | 100 MHz |
| 8:2 | 2.53 | 2.54 | 2.52 | 0.018 | 0.016 | 0.016 |
| 6:4 | 2.13 | 2.15 | 2.20 | 0.012 | 0.011 | 0.011 |
| 4:6 | 2.03 | 2.04 | 2.08 | 0.008 | 0.007 | 0.007 |
| 2:8 | 3.06 | 3.15 | 3.4 | 0.043 | 0.049 | 0.046 |

TABLE 4

| weight ratio of A and B | coefficient of thermal expansion (ppm/° C.) |
| --- | --- |
| 6:4 | 35 |
| 4:6 | 39 |

TABLE 5

| weight ratio of A and B | Reliability evaluation |
| --- | --- |
| 8:2 | NG (cracking) |
| 6:4 | OK |
| 4:6 | OK |
| 2:8 | NG (cracking) |

Referring to Tables 3 to 5, the insulating layer according to the embodiment has a low dielectric constant and a coefficient of thermal expansion when polyphenyl ether (A) and tricyclodecane based di-acrylete (B) satisfy a ratio of 4:6 to 6:4, and it can be seen that the reliability is improved by the improved mechanical strength. On the other hand, when the insulating layer does not satisfy the ratio of polyphenyl ether (A) and tricyclodecane based di-acrylete (B), mechanical strength may decrease and cracks may occur in the insulating layer, it can be seen that the dielectric constant is increased, making it unsuitable for use as an insulating layer of a high frequency circuit board.

The circuit board according to the embodiment may include a buffer layer disposed between the insulating layer and the circuit pattern.

That is, in the circuit board according to the embodiment, the buffer layer may be formed on a surface of the circuit pattern or the buffer layer may be formed on the insulating layer.

The buffer layer may be disposed between the insulating layer and the circuit pattern to improve adhesion between the insulating layer and the circuit pattern.

That is, the insulating layer and the circuit pattern are heterogeneous materials including a resin material and a metal, respectively, and when the circuit pattern is formed on the insulating layer, there is a problem in that adhesion is reduced.

Accordingly, by disposing a buffer layer chemically bonded to the insulating layer and the circuit pattern between the insulating layer and the circuit pattern, adhesion between the insulating layer and the circuit pattern may be improved.

That is, the buffer layer includes a plurality of functional groups coupled to the insulating layer and the circuit pattern, the functional groups are chemically bonded to the insulating layer and the circuit pattern by a covalent bond or a coordination bond, and thereby adhesion between the insulating layer and the circuit pattern may be improved.

Accordingly, even when the surface roughness of the insulating layer is reduced, it is possible to secure adhesion reliability between the insulating layer and the circuit pattern.

Therefore, even when the circuit board according to the embodiment is used for a high frequency purpose, it is possible to reduce the transmission loss of the high frequency signal by maintaining the surface roughness of the circuit pattern low, even if the surface roughness of the circuit pattern is kept low, it is possible to secure the adhesion between the insulating layer and the circuit pattern by the buffer layer, and thereby, the overall reliability of the circuit pattern can be ensured.

In addition, the circuit board according to the embodiment may include an insulating layer having improved strength with a low dielectric constant and a low coefficient of thermal expansion.

In detail, the insulating layer includes a first material and a second material having a low dielectric constant and improved strength, and as the first material is formed in the insulating layer to be disposed inside the network structure of the second material, and thereby phase separation of the first material and the second material may be prevented. Accordingly, the insulating layer may form the first material and the second material as a single phase, thereby improving the strength of the insulating layer.

That is, by increasing the free volume, that is, molecular motion, of the second material having a network structure by cross-linking, polymer chains having a network structure can be structured so that they are not closely arranged, and as the first material is partially disposed inside the network structure, the first material and the second material may be formed as a single phase inside the insulating layer.

Therefore, when the circuit board according to the embodiment is used for high-frequency applications, it is possible to reduce the transmission loss of the high-frequency signal by reducing the dielectric constant of the insulating layer, and the overall reliability of the circuit board can be secured by improving the thermal expansion coefficient and mechanical strength of the insulating layer.

In addition, since the circuit board according to the embodiment includes an insulating layer having a low dielectric constant and a low thermal window coefficient, it can replace the existing insulating layer including glass fibers. Specifically, the circuit board according to the embodiment may remove the glass fiber included in the insulating layer. Specifically, in the circuit board according to the embodiment, the dielectric constant and the coefficient of thermal expansion of the insulating layer can be easily adjusted by using the resin and the filler constituting the RCC (Resin coated copper), and accordingly, the overall thickness of the printed circuit board can be reduced by configuring the insulating layer with the conventional RCC that does not include glass fibers. Furthermore, since the circuit board according to the embodiment is composed of an insulating layer having a low coefficient of thermal expansion, it is possible not only to remove the core layer for securing strength, but also to reduce the thickness of the insulating layer, and accordingly, it is possible to provide an insulating layer having a thickness smaller than that of the circuit pattern.

What is claimed is:

1. A circuit board comprising: a first insulating layer; a first circuit pattern disposed on and under the first insulating layer; a first via passing through the first insulating layer; a second insulating layer disposed on the first insulating layer; a second circuit pattern disposed on the second insulating layer; a second via passing through the second insulating layer; a third insulating layer disposed under the first insulating layer; a third circuit pattern disposed under the third insulating layer; and a third via passing through the third insulating layer; wherein the first insulating layer is provided with an insulating material including glass fibers, wherein each of the second insulating layer and the third insulating layer is provided with an insulating material that does not include a glass fiber, wherein each thickness of the second insulating layer and the third insulating layer is smaller than a thickness of layers of the first insulating layer, wherein a thickness of the first via is greater than a thickness of each of the first circuit patterns; wherein a thickness of the second via is smaller than a thickness of the second circuit pattern; and wherein a thickness of the third via is smaller than a thickness of the third circuit pattern.

2. The circuit board of claim 1, wherein the second insulating layer is composed of a plurality of layers on the first insulating layer, and
wherein the third insulating layer is composed of a plurality of layers under the lower surface of the first insulating layer.

3. The circuit board of claim 1,
wherein the first insulating layer is provided in a plurality of layers laminated in a vertical direction.

4. The circuit board of claim 3,
wherein each of the plurality of the layers of the first insulating layer include a first layer, a second layer disposed on the first layer, a third layer disposed on the second layer, and a fourth layer disposed on the third layer, and
wherein the first via includes a first via part passing through at least a portion of the first layer along the vertical direction, a second via part passing through at least a portion of the second layer along the vertical direction, a third via part passing through at least a portion of the third layer along the vertical direction, and a fourth via part passing through at least a portion of the fourth layer along the vertical direction.

5. The circuit board of claim 4, wherein a slope of the first via part or the second via part is different from a slope of the third via part or the fourth via part.

6. The circuit board of claim 5, wherein a slope of the first via part is the same as a slope of the second via part, and
wherein a slope of the third via part is the same as a slope of the fourth via part.

7. The circuit board of claim 6,
wherein each of the first via part and the second via part has a first slope in which width gradually increases from an upper surface to a lower surface, and
wherein each of the third via part and the fourth via part has a second slope in which width gradually decreases from an upper surface to a lower surface.

8. The circuit board of claim 1, wherein the thickness of the second via is smaller than the thickness of each of the first to third circuit pattern.

9. The circuit board of claim 1, wherein the thickness of the third via is smaller than the thickness of each of the first to third circuit patterns.

10. The circuit board of claim 1, wherein each of the second and third insulating layers includes a first compound including polyphenyl ether (PPE); and a second compound including tricyclodecane and a terminal group connected to the tricyclodecane, and
wherein a weight ratio of the first compound to the second compound is 4:6 to 6:4.

11. The circuit board of claim 10, wherein the terminal group includes at least one of an acrylate group, an epoxide group, a carboxyl group, a hydroxyl group, and an isocyanate group.

12. The circuit board of claim 10, wherein the first compound and the second compound are not chemically bound.

13. The circuit board of claim 5, wherein a coefficient of thermal expansion and a dielectric constant of each of the second and third insulating layers are smaller than a coefficient of thermal expansion and a dielectric constant of each of the plurality of layers of the first insulating layer.

14. The circuit board of claim 13, wherein the dielectric constant of each of the second and third insulating layers is 2.03 to 2.7.

* * * * *